(12) United States Patent
Lee

(10) Patent No.: US 11,177,453 B2
(45) Date of Patent: Nov. 16, 2021

(54) DISPLAY DEVICE

(71) Applicant: LG Display Co., Ltd., Seoul (KR)

(72) Inventor: Sungwoo Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/544,676

(22) Filed: Aug. 19, 2019

(65) Prior Publication Data

US 2020/0111988 A1 Apr. 9, 2020

(30) Foreign Application Priority Data

Oct. 5, 2018 (KR) .................. 10-2018-0118966

(51) Int. Cl.
*G09G 3/3275* (2016.01)
*H01L 51/52* (2006.01)
*H01L 27/32* (2006.01)

(52) U.S. Cl.
CPC ....... *H01L 51/5237* (2013.01); *G09G 3/3275* (2013.01); *H01L 27/3276* (2013.01)

(58) Field of Classification Search
CPC ........... G02F 1/13452; G02F 1/136286; G02F 1/1345; G02F 1/134309; G02F 1/13456; G02F 1/13458; G02F 1/136227; G02F 2201/56; H01L 27/3276; H01L 27/124; H01L 27/326; G09G 3/2085; G09G 3/14; G09G 3/2096; G09G 3/2092; G09G 2300/0426; G09G 2300/0421; G09G 2300/04; G09G 2310/0232; G09G 2310/0281; G09G 2310/0278
See application file for complete search history.

(56) References Cited

U.S. PATENT DOCUMENTS

| | | | | |
|---|---|---|---|---|
| 6,433,841 | B1* | 8/2002 | Murade | G02F 1/13454 349/110 |
| 2002/0018176 | A1* | 2/2002 | Kobayashi | G02F 1/136286 349/200 |
| 2002/0117691 | A1* | 8/2002 | Choi | H01L 27/12 257/225 |
| 2008/0203391 | A1* | 8/2008 | Kim | G02F 1/1345 257/59 |
| 2008/0284697 | A1* | 11/2008 | Nam | G02F 1/136286 345/87 |
| 2012/0127412 | A1* | 5/2012 | Lee | G02F 1/1345 349/139 |

(Continued)

FOREIGN PATENT DOCUMENTS

KR 10-2017-0078466 A 7/2017

*Primary Examiner* — Nitin Patel
*Assistant Examiner* — Amen W. Bogale
(74) *Attorney, Agent, or Firm* — Fenwick & West LLP

(57) ABSTRACT

A display device is disclosed. The display device comprises: a substrate comprising a display area where a plurality of sub-pixels are arranged and a non-display area surrounding the display area; a data driver disposed in the non-display area of the substrate; a GIP driver disposed in the non-display area, adjacent to the display area; data link lines extending from the data driver to the display area; gate link lines extending from the GIP driver to the display area; and a passivation film disposed on the gate link lines, wherein the passivation film comprises one or more passivation holes that are arranged between the gate link lines, at the intersections of the data link lines and the gate link lines.

9 Claims, 12 Drawing Sheets

(56) References Cited

U.S. PATENT DOCUMENTS

| | | | |
|---|---|---|---|
| 2012/0206684 A1* | 8/2012 | Lee | G02F 1/1337 349/139 |
| 2013/0148049 A1* | 6/2013 | Abe | G02F 1/136204 349/43 |
| 2013/0257841 A1* | 10/2013 | Shim | G02F 1/1345 345/212 |
| 2013/0293595 A1* | 11/2013 | Kim | G09G 3/3611 345/690 |
| 2014/0300852 A1* | 10/2014 | Yoshida | G02F 1/134363 349/143 |
| 2016/0020224 A1* | 1/2016 | Kawamura | G02F 1/1345 345/213 |
| 2017/0309644 A1* | 10/2017 | Yeh | G02F 1/1362 |
| 2017/0337873 A1* | 11/2017 | Kim | G09G 3/3233 |
| 2018/0083072 A1* | 3/2018 | Kwon | H01L 27/3262 |
| 2019/0304366 A1* | 10/2019 | Ka | G02F 1/13452 |
| 2019/0391454 A1* | 12/2019 | Koide | H01L 27/124 |
| 2019/0393245 A1* | 12/2019 | Xi | G09G 3/20 |
| 2020/0168633 A1* | 5/2020 | Ina | G02F 1/1368 |
| 2020/0185428 A1* | 6/2020 | Um | H01L 27/3262 |

\* cited by examiner

DISPLAY DEVICE

CROSS-REFERENCE TO RELATED APPLICATIONS

This application claims the priority benefit of Republic of Korea Patent Application No. 10-2018-0118966 filed on Oct. 5, 2018 which is incorporated by reference in its entirety.

BACKGROUND

Field of Technology

The present disclosure relates to a display device, and more particularly, to a display device capable of preventing a short-circuit fault between gate link lines.

Related Art

With the development of the information society, various demands for display devices for displaying images are on the rise. In the field of display devices, flat panel display devices (FPDs), which are thin and light and can cover a large area, have been rapidly replacing cathode ray tubes (CRTs), which are bulky. The flat panel display devices include liquid-crystal displays (LCDs), plasma display panels (PDPs), organic light-emitting displays (OLEDs), electrophoretic display devices (EDs), etc.

Among these types of displays, the organic light-emitting displays are self-luminous devices, and have fast response time, high light emission efficiency, great brightness, and wide viewing angles. Notably, the organic light-emitting displays can be fabricated on a flexible substrate, and have advantages over plasma display panels or inorganic electroluminescence (EL) displays in that they can operate at a low voltage, have lower power consumption, and deliver vivid color reproduction.

Recently, narrow bezel displays have been drawing attention, which have a slimmer bezel, i.e., a non-display area, where no images are displayed. In the non-display area, gate link lines for applying a scan signal from a GIP driver to a display area and data link lines for applying a data signal from a data driver to the display area intersect or overlap each other. Notably, the arrangement of a plurality of link lines is becoming more elaborate and complicated to enable a narrow-bezel design.

SUMMARY

The present disclosure provides a display device capable of preventing a short-circuit fault between gate link lines. In the present disclosure, passivation holes are arranged between the gate link lines, and after patterning the gate link lines, any gate link residual film left between the gate link lines may be removed through a dry-etching process for forming the passivation holes. Accordingly, there is provided a display device capable of preventing operational defects in scan signals as the gate link lines are not short-circuited by the residual film.

An exemplary embodiment of the present disclosure provides a display device comprising: a substrate comprising a display area where a plurality of sub-pixels are arranged and a non-display area surrounding the display area; a data driver disposed in the non-display area of the substrate; a GIP driver disposed in the non-display area, adjacent to the display area; data link lines extending from the data driver to the display area; gate link lines extending from the GIP driver to the display area; and a passivation film disposed on the gate link lines, wherein the passivation film comprises one or more passivation holes that are arranged between the gate link lines, at the intersections of the data link lines and the gate link lines.

In an aspect, the passivation holes may be parallel to the gate link lines, spaced apart from the gate link lines. The passivation holes may be disposed between two the gate link lines, the passivation holes are formed of a plurality of passivation holes. The passivation holes are spaced out, with at least two gate link lines in between.

In an aspect, each sub-pixel may comprise: a semiconductor layer disposed on the substrate; a gate insulating film disposed on the semiconductor layer; a gate electrode disposed on the gate insulating film; a first interlayer insulating film disposed on the gate electrode; a second interlayer insulating film disposed on the first interlayer insulating film; and a source electrode and drain electrode disposed on the second interlayer insulating film and connected to the semiconductor layer.

In an aspect, the data link lines may comprise first data link lines and second data link lines which are arranged on different layers. The first data link lines may be disposed between the gate insulating film and the first interlayer insulating film, and the second data link lines may be disposed between the first interlayer insulating film and the second interlayer insulating film. The first data link lines and the second data link lines may be alternately disposed.

In an aspect, the gate link lines may be disposed on the second interlayer insulating film.

In an aspect, the passivation holes may penetrate the passivation film and exposes the second interlayer insulating film underlying the passivation film.

BRIEF DESCRIPTION OF THE DRAWINGS

The accompany drawings, which are included to provide a further understanding of the invention and are incorporated on and constitute a part of this specification, illustrate embodiments of the invention and together with the description serve to explain the principles of the invention. In the drawings.

DETAILED DESCRIPTION

Figure 1:
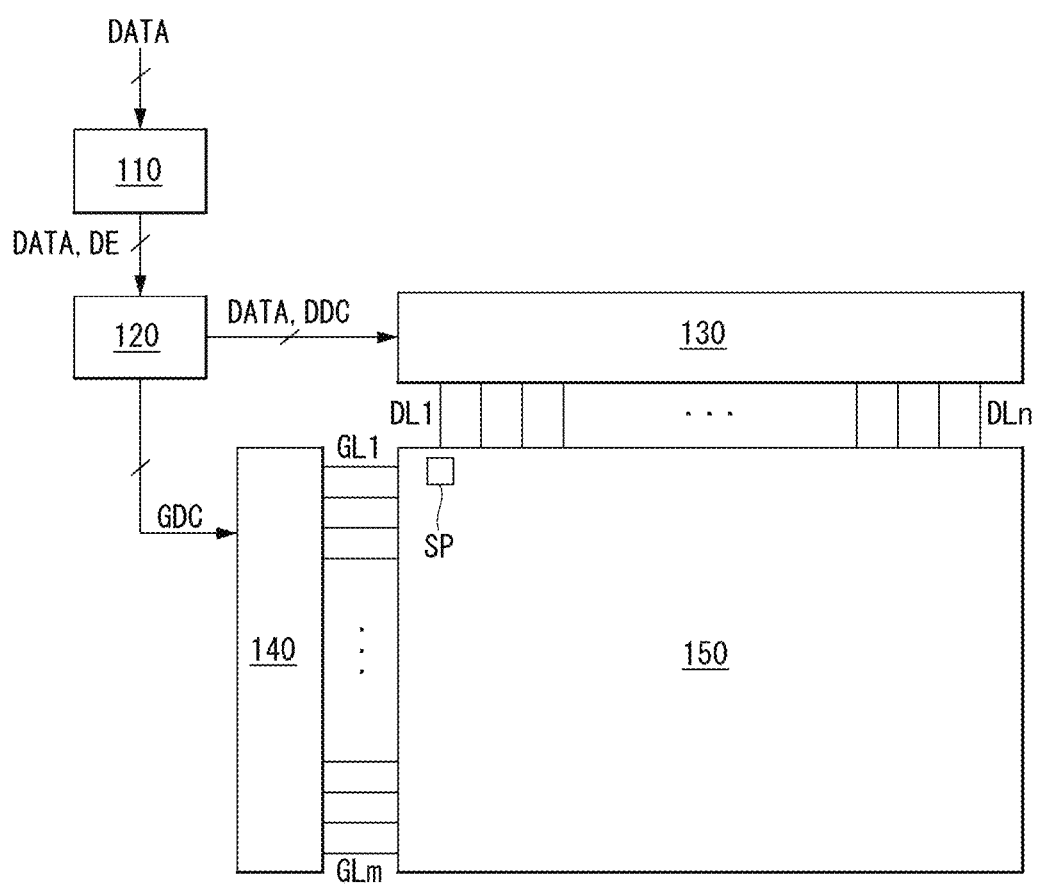
FIG. 1 is a schematic block diagram of an organic light-emitting display.

Various aspects and features of the present disclosure and methods of accomplishing them may be understood more readily by reference to the following detailed descriptions of exemplary embodiments and the accompanying drawings. The present disclosure may, however, be embodied in many different forms and should not be construed as being limited to the exemplary embodiments set forth herein. Rather, these exemplary embodiments are provided so that this disclosure will be thorough and complete and will fully convey the concept of the present invention to those skilled in the art, and the present invention is defined by the appended claims.

The shapes, sizes, proportions, angles, numbers, etc. shown in the figures to describe the exemplary embodiments of the present disclosure are merely examples and not limited to those shown in the figures. Like reference numerals denote like elements throughout the specification. In describing the present invention, detailed descriptions of related well-known technologies will be omitted to avoid unnecessary obscuring the present invention. When the terms 'comprise', 'have', and the like are used, other parts may be added as long as the term 'only' is not used. The singular forms may be interpreted as the plural forms unless explicitly stated.

The elements may be interpreted to include an error margin even if not explicitly stated.

When the position relation between two parts is described using the terms "on", "over", "under", "next to" and the like, one or more parts may be positioned between the two parts as long as the term "immediately" or "directly" is not used.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, an electroluminescence display according to an exemplary embodiment of the present disclosure will be described in detail with reference to the attached drawings. Throughout the specification, like reference numerals denote substantially like components. In describing the present disclosure, a detailed description of known functions or configurations related to the present disclosure will be omitted when it is deemed that they may unnecessarily obscure the subject matter of the present invention.

A display device according to the present disclosure is a display device in which display elements are formed on a glass substrate or flexible substrate. Although examples of the display device comprise an organic light-emitting display, a liquid-crystal display, and an electrophoretic display, etc., the present disclosure will be described with respect to an organic light-emitting display. The organic light-emitting display comprises an organic layer composed of organic materials situated between a first electrode as an anode and a second electrode as a cathode. A hole from the first electrode and an electron from the second electrode recombine within the organic layer, forming an exciton, i.e., a hole-electron pair. Then, energy is created as the exciton returns to the ground state, thereby causing the display device to emit light itself.

Figure 2:
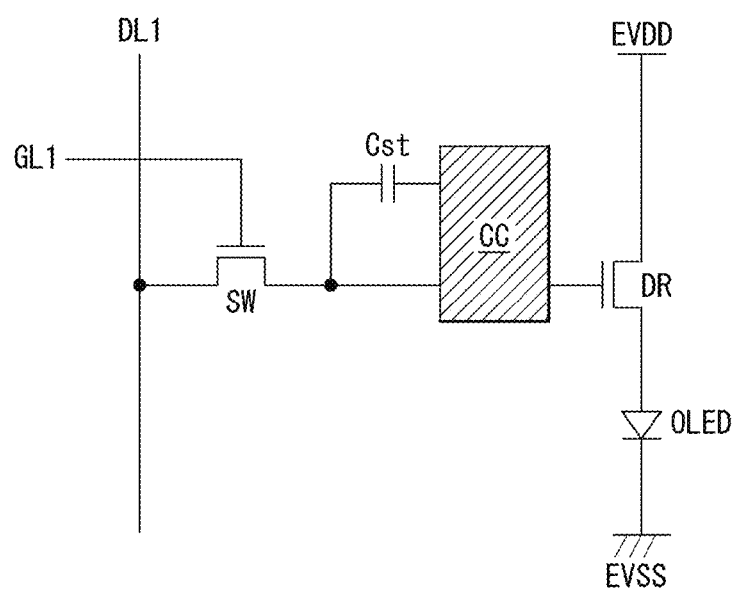
FIG. 2 is a schematic circuit diagram of a sub-pixel.
Figure 3:
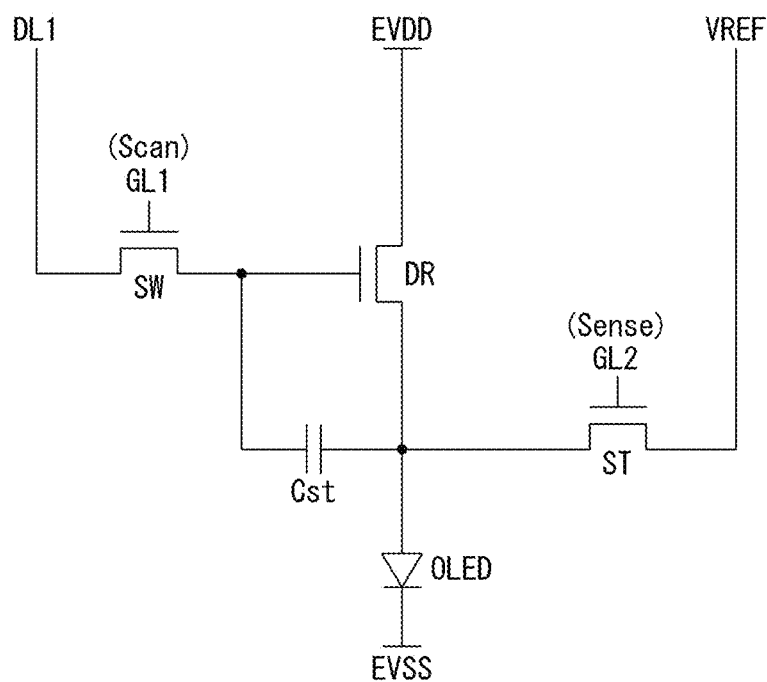
FIG. 3 is a detailed circuit diagram of a sub-pixel.

FIG. 1 is a schematic block diagram of an organic light-emitting display. FIG. 2 is a schematic circuit diagram of a sub-pixel. FIG. 3 is a detailed circuit diagram of a sub-pixel.

Referring to FIG. 1, an organic light-emitting display comprises an image processor 110, a timing controller 120, a data driver 130, a scan driver 140, and a display panel 150.

The image processor 110 outputs a data enable signal DE together with a data signal DATA supplied from the outside. The image processor 110 may output one or more among a vertical synchronization signal, horizontal synchronization signal, and clock signal, in addition to the data enable signal DE, but these signals are not shown in the drawings for convenience of explanation.

The timing controller 120 receives the data signal DATA from the image processor 110, along with the data enable signal DE or driving signals including the vertical synchronization signal, horizontal synchronization signal, and clock signal. Based on the driving signals, the timing controller 120 outputs a gate timing control signal GDC for controlling the operation timing of the scan driver 140 and a data timing control signal DDC for controlling the operation timing of the data driver 130.

In response to the data timing control signal DDC supplied from the timing controller 120, the data driver 130 samples and latches the data signal DATA supplied from the timing controller 120, converts it to a gamma reference voltage, and outputs the gamma reference voltage. The data driver 130 outputs the data signal DATA through data lines DL1 to DLn. The data driver 130 may be formed in the form of an IC (integrated circuit).

In response to the gate timing control signal GDC supplied from the timing controller 120, the scan driver 140 outputs a scan signal. The scan driver 140 outputs the scan signal through gate lines GL1 to GLm. The scan driver 140 is formed in the form of an IC (integrated circuit), or is formed on the display panel 150 by a gate-in-panel (GIP) technology.

The display panel 150 displays an image, corresponding to the data signal DATA and scan signal respectively supplied from the data driver 130 and scan driver 140. The display panel 150 includes sub-pixels SP which work to display an image.

The sub-pixels SP comprise red sub-pixels, green sub-pixels, and blue sub-pixels, or comprise white sub-pixels, red sub-pixels, green sub-pixels, and blue sub-pixels. The sub-pixels SP may have one or more different emission areas depending on their emission characteristics.

As shown in FIG. 2, each sub-pixel comprises a switching transistor SW, a driving transistor DR, a capacitor Cst, a compensation circuit CC, and an organic light emitting diode OLED.

In response to a scan signal supplied through the first gate line GL1, the switching transistor SW performs a switching operation so that a data signal supplied through the first data line DL1 is stored as a data voltage in the capacitor Cst. The driving transistor DR operates in such a way that a driving current flows between a power supply line EVDD (highlevel voltage) and a cathode power supply line EVSS (low-level voltage) in response to the data voltage stored in the capacitor Cst. The organic light-emitting diode OLED operates in such a way as to emit light by the driving current formed by the driving transistor DR.

The compensation circuit CC is a circuit that is added into the sub-pixel to compensate for the threshold voltage, etc. of the driving transistor DR. The compensation circuit CC comprises one or more transistors. The compensation circuit CC has a wide variety of configurations depending on the compensation method, and an example of this will be described below.

As shown in FIG. 3, the compensation circuit CC comprises a sensing transistor ST and a sensing line VREF (or a reference line). The sensing transistor ST is connected between a source electrode of the driving transistor DR and the anode (hereinafter, sensing node) of the organic light-emitting diode OLED. The sensing transistor ST operates in such a way as to supply a reset voltage (or sensing voltage) delivered through the sensing line VREF to the sensing node of the driving transistor DR or to sense a voltage or current at the sensing node of the driving transistor DR or at the sensing line VREF.

A drain electrode of the switching transistor SW is connected to the first data line DL1, and a source electrode of the switching transistor SW is connected to a gate electrode of the driving transistor DR. A drain electrode of the driving transistor DR is connected to the power supply line EVDD, and a source electrode of the driving transistor DR is connected to the anode of the organic light-emitting diode OLED. An upper electrode of the capacitor Cst is connected to the gate electrode of the driving transistor DR, and a lower electrode of the capacitor Cst is connected to the anode of the organic light-emitting diode OLED. The anode of the organic light-emitting diode OLED is connected to the source electrode of the driving transistor DR, and the cathode of the organic light-emitting diode OLED is connected to the second power supply line EVSS. A drain electrode of the sensing transistor ST is connected to the sensing line VREF, and a source electrode of the sensing transistor ST is connected to the anode of the organic light-emitting diode OLED and the source electrode of the driving transistor DR.

The operating time of the sensing transistor ST may be similar/identical to the operating time of the switching transistor SW according to an external compensation algorithm (or the configuration of the compensation circuit). For example, the gate electrode of the switching transistor SW may be connected to the first gate line GL1, and the gate electrode of the sensing transistor ST may be connected to the second gate line GL2. In this case, a scan signal Scan is transmitted to the first gate line GL1, and a sensing signal Sense is transmitted to the second gate line GL2. In another example, the first gate line GL1 connected to the gate electrode of the switching transistor SW and the second gate line GL2 connected to the gate electrode of the sensing transistor ST may be connected to be shared in common.

The sensing line VREF may be connected to the data driver. In this case, the data driver may sense the sensing node of the sub-pixel in real time, during an image non-display period or for a period of N frames (N being an integer equal to or greater than 1) and generate a sensing result. Meanwhile, the switching transistor SW and the sensing transistor ST may be turned on at the same time. In this case, a sensing operation through the sensing line VREF and a data output operation for outputting a data signal are distinguished from each other on the basis of a time division method of the data driver.

A digital data signal, an analog data signal, or a gamma voltage may be compensated according to the sensing result. Also, a compensation circuit that generates a compensation signal (or compensation voltage) based on the sensing result may be implemented within the data driver, within the timing controller, or as a separate circuit.

Besides, although FIG. 3 illustrates an example in which each sub-pixel has a 3T(transistor)1C(capacitor) structure comprising a switching transistor SW, a driving transistor DR, a capacitor Cst, an organic light-emitting diode OLED, and a sensing transistor ST, each sub-pixel may have various alternative structures like 3T2C, 4T2C, 5T1C, 6T2C, etc. if the compensation circuit CC is added to the sub-pixel.

Figure 4:
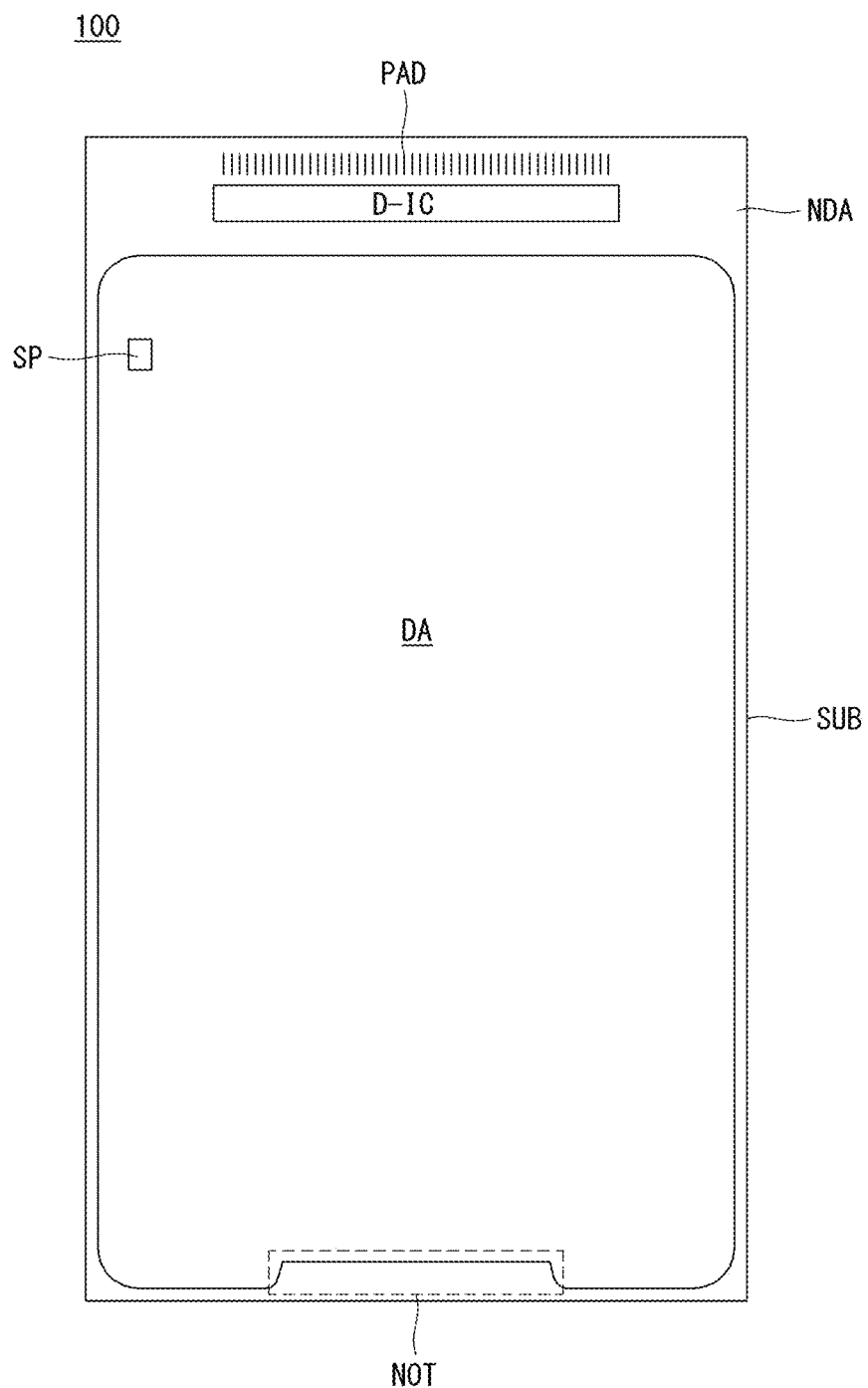
FIG. 4 is a view showing a display device according to an exemplary embodiment of the present disclosure.
Figure 5:
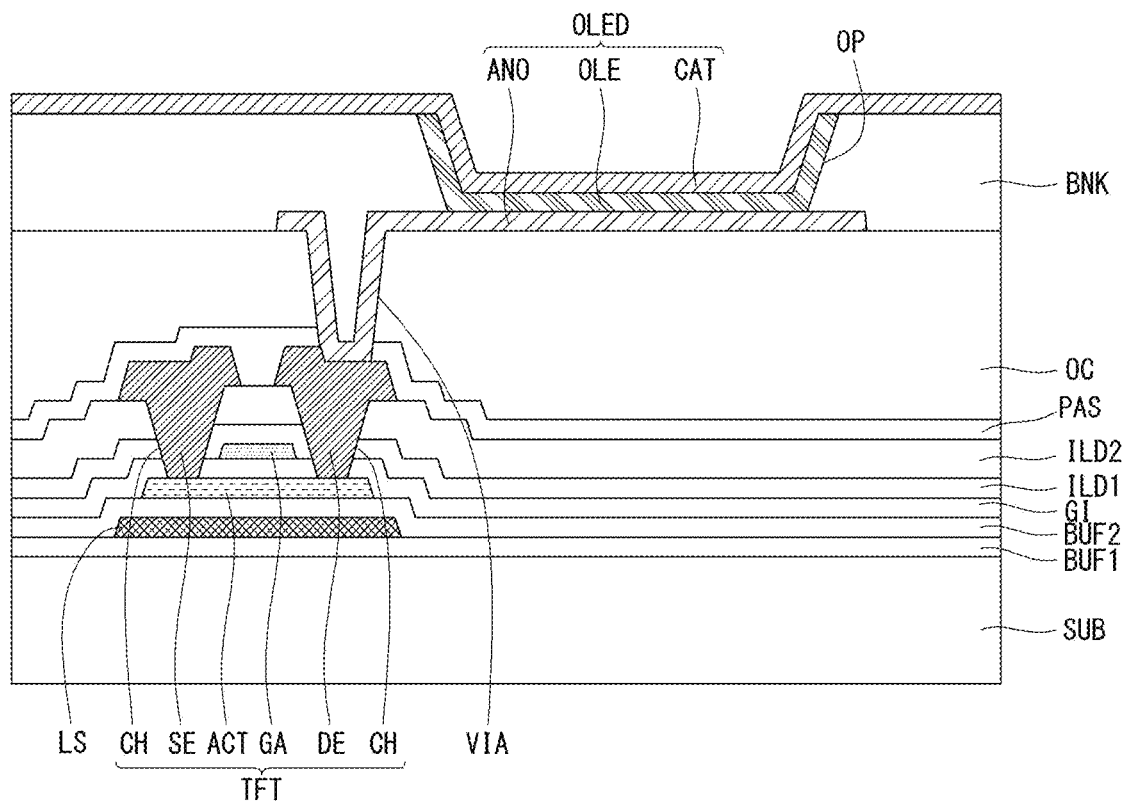
FIG. 5 is a cross-sectional view showing a sub-pixel of the display device according to the exemplary embodiment of the present disclosure.

FIG. 4 is a view showing a display device according to an exemplary embodiment of the present invention. FIG. 5 is a cross-sectional view showing a sub-pixel of the display device according to the exemplary embodiment of the present invention.

Referring to FIG. 4, a display device 100 according to the exemplary embodiment of the present disclosure is a rectangular shape, with a notched portion NOT formed on one side. The notched portion NOT is formed on one side of a display area DA by extending opposite sides of the display area DA, where a camera, a speaker, etc. may be placed.

The display device 100 comprises a display area DA that displays an image, where a plurality of sub-pixels SP, data and gate lines connected to the sub-pixels, and power supply lines are arranged, and a non-display area NDA surrounding the outer perimeter of the display area DA.

A data driver D-IC for applying a data signal to the display area DA is placed on one side of the non-display area NDA. A pad portion PAD is placed between the data driver D-IC and the edge of a substrate SUB, where a chip-on-film (COF) is bonded so that signals required for driving, such as a scan signal, data signal, and electrical power, are inputted from an external printed circuit board (not shown).

Hereinafter, a cross-sectional structure of a sub-pixel (SP) region in the display area DA of the display device 100 according to the present invention will be described with reference to FIG. 5.

Referring to FIG. 5, in a sub-pixel according to an exemplary embodiment of the present disclosure, a first buffer layer BUF1 is disposed on a substrate SUB. The substrate SUB may be a polyimide substrate, for example. Thus, the substrate SUB of the present disclosure has flexibility. The first buffer layer BUF1 serves to protect thin-film transistors to be formed in a subsequent process from gases leaking out of the substrate SUB or from impurities. The first buffer layer BUF1 may be a silicon oxide (SiOx), a silicon nitride (SiNx), or multiple layers of these compounds.

A shield layer LS is disposed on the first buffer layer BUF1. The shield layer LS serves to prevent a reduction in panel drive current that may occur from the use of the polyimide substrate and prevent an optical current by blocking light from illuminating a semiconductor layer. A second buffer layer BUF2 is disposed on the shield layer LS. The second buffer layer BUF2 serves to protect the thin-film transistors to be formed in the subsequent process. The second buffer layer BUF2 may be a silicon oxide (SiOx), a silicon nitride (SiNx), or multiple layers of these compounds.

A semiconductor layer ACT is disposed on the second buffer layer BUF2. The semiconductor layer ACT may be formed of silicon semiconductor or oxide semiconductor. The silicon semiconductor may comprise amorphous silicon or crystallized polycrystalline polysilicon. The polycrystalline silicon has a high mobility (for example, more than 100 cm$^2$/Vs), low energy consumption, and excellent reliability. Thus, the polycrystalline silicon can be applied to a gate driver for driving elements and/or multiplexers (MUX) or applied to driving TFTs in pixels. Meanwhile, the oxide semiconductor is suitable for a switching TFT which has a short ON-time and a long OFF-time, because of its low OFF-current. Also, the oxide semiconductor is suitable for a display device which requires low-speed operation and/or low power consumption because the oxide semiconductor can increase a voltage hold time of the pixel due to the low OFF-current. In addition, the semiconductor layer ACT comprises a drain region and a source region each containing p-type or n-type impurities, and also comprises a channel between the drain region and the source region.

A gate insulating film GI is disposed on the semiconductor layer ACT. The gate insulating film GI may be silicon oxide SiOx, silicon nitride SiNx, or multiple layers of these compounds. A gate electrode GA is disposed on the gate insulating film GI, corresponding to a certain area of the semiconductor layer ACT, that is, a channel through which impurities are introduced. The gate electrode GA may be formed of any one selected from the group consisting of molybdenum (Mo), aluminum (Al), chrome (Cr), gold (Au), titanium (Ti), nickel (Ni), neodymium (Nd), and copper (Cu) or alloys of these elements. Further, the gate electrode GA may be multiple layers of any one selected from the group consisting of molybdenum (Mo), aluminum (Al), chrome (Cr), gold (Au), titanium (Ti), nickel (Ni), neodymium (Nd), copper (Cu), or multiple layers of alloys of these elements. For example, the gate electrode GA may be formed of dual layers of molybdenum/aluminum-neodymium or molybdenum/aluminum.

A first interlayer insulating film ILD1 and second interlayer insulating film ILD2 for insulating the gate electrode GA are disposed on the gate electrode GA. The first and second interlayer insulating films ILD1 and ILD2 may be a silicon oxide film (SiOx), a silicon nitride film (SiNx), or multiple layers of these compounds. While this exemplary embodiment discloses an interlayer insulating film formed of two layers, the interlayer insulating film may be formed of two or three layers. Contact holes CH exposing part of the semiconductor layer ACT, for example, the source and drain regions, are located in some regions of the interlayer insulating films ILD1 and 2 and gate insulating film GI.

A drain electrode DE and a source electrode SE are disposed on the second interlayer insulating film ILD2. The drain electrode DE is connected to the semiconductor layer ACT via a contact hole CH exposing the drain region of the semiconductor layer ACT, and the source electrode SE is connected to the semiconductor layer ACT via the contact hole CH exposing the source region of the semiconductor layer ACT. The source electrode SE and the drain electrode DE may comprise of a single layer or multiple layers. If the source electrode SE and the drain electrode DE comprise of a single layer, they may be formed of any one selected from the group consisting of molybdenum (Mo), aluminum (Al), chrome (Cr), gold (Au), titanium (Ti), nickel (Ni), neodymium (Nd), and copper (Cu), or an alloy of these elements. On the other hand, if the source electrode SE and the drain electrode DE consist of multiple layers, they may be formed of two layers of molybdenum/aluminum-neodymium or three layers of titanium/aluminum/titanium, molybdenum/aluminum/molybdenum, or molybdenum/aluminum-neodymium/molybdenum. As such, a thin film transistor TFT comprising the semiconductor layer ACT, the gate electrode GA, the drain electrode DE, and the source electrode SE is formed.

A passivation film PAS is disposed on the substrate SUB comprising the thin-film transistor TFT. The passivation film PAS is an insulating film that protects the underlying elements, and may be a silicon oxide film (SiOx), a silicon nitride film (SiNx), or multiple layers of these compounds. An overcoat layer OC is disposed on the passivation film PAS. The overcoat layer OC may be a planarization film for smoothing out step differences on the underlying structure, and is formed of an organic material such as polyimide, benzocyclobutene-based resin, acrylate, etc. The overcoat layer OC may be formed by a method such as SOG (spin on glass), by which the organic material is coated in liquid form and hardened.

A via hole VIA exposing the drain electrode DE is located in some region of the overcoat layer OC. An organic light-emitting diode OLED is disposed on the overcoat layer OC. More specifically, a first electrode ANO is disposed on the overcoat layer OC. The first electrode ANO may act as a pixel electrode, and is connected to the drain electrode DE of the thin-film transistor TFT via the via hole VIA. The first electrode ANO is an anode, and may be formed of a transparent conductive material, for example, ITO (indium tin oxide), IZO (indium zinc oxide), or ZnO (zinc oxide). If the first electrode ANO is a reflective electrode, the first electrode ANO further comprises a reflective layer. The reflective layer may be formed of aluminum (Al), copper (Cu), silver (Ag), nickel (Ni), or an alloy of these elements, preferably, APC (silver/palladium/copper alloy).

A bank layer BNK for defining a pixel is disposed on a flexible substrate comprising the first electrode ANO. The bank layer BNK is formed of an organic material such as polyimide, benzocyclobutene-based resin, acrylate, etc. The bank layer BNK has a pixel defining portion OP exposing the first electrode ANO. An organic film layer OLE contacting the first electrode ANO is located on the entire surface of the substrate SUB. The organic film layer OLE is a layer that emits light by the recombination of electrons and holes. A hole injection layer or hole transport layer may be formed between the organic film layer OLE and the first electrode ANO, and an electron transport layer or electron injection layer may be formed on the organic film layer OLE.

A second electrode CAT is disposed on the organic film layer OLE. The second electrode CAT is located on the entire surface of the display area DA and is a cathode, which may be formed of magnesium (Mg), calcium (Ca), aluminum (Al), silver (Ag), or an alloy thereof that has a low work function. If the second electrode CAT is a transmissive electrode, it may be formed thin enough to pass light through. If the second electrode CAT is a reflective electrode, it may be formed thick enough to reflect light.

Meanwhile, the display device 100 comprises a data driver D-IC and a gate driver GIP placed in the non-display area NDA, in order to drive a plurality of sub-pixels arranged in the display area DA. The data driver D-IC is placed adjacent to the display area DA.

Figure 6:
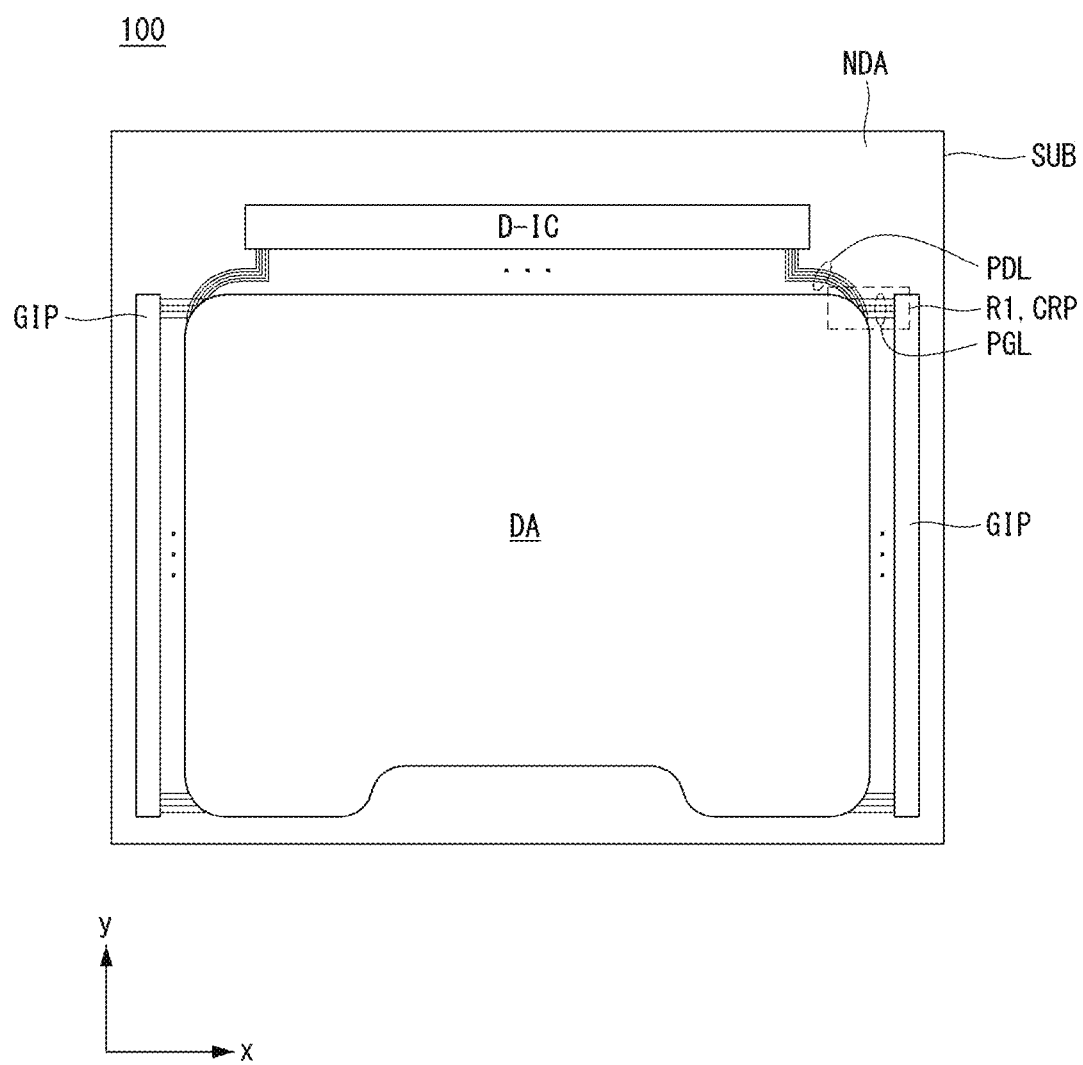
FIG. 6 is a plan view schematically showing a display device according to an embodiment of the present disclosure.
Figure 7:
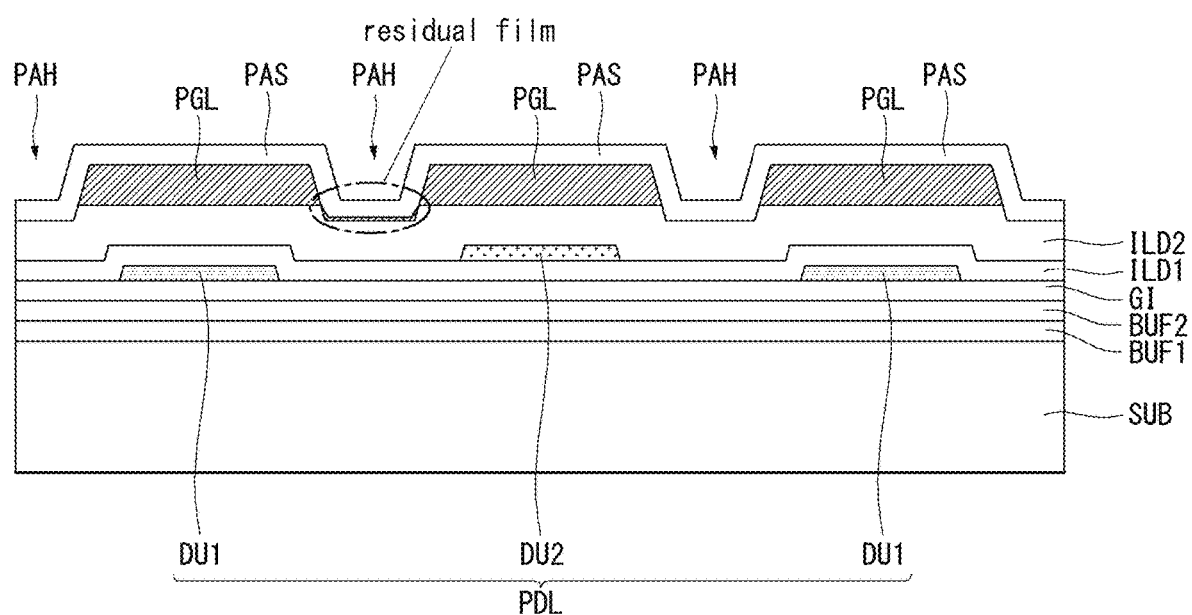
FIG. 7 is a cross-sectional view showing the intersections of data link lines and gate link lines according to an embodiment of the present disclosure.

FIG. 6 is a plan view schematically showing a display device according to the present invention. FIG. 7 is a cross-sectional view showing the intersections of data link lines and gate link lines.

Referring to FIG. 6, data link lines PDL connected from the data driver D-IC to the display area DA are arranged in the non-display area NDA of the display device 100 of the present disclosure, in order to apply a data signal to the display area DA, and gate link lines PGL connected from the GIP driver GIP to the display area DA are arranged in the non-display area NDA, in order to apply a scan signal to the display area DA.

In an example, double feeding may be adopted in which the GIP driver GIP is placed on opposite sides of the display area DA and gate lines (not shown) on one side extending to the display area DA through the gate link lines PGL of the GIP driver GIP are connected to the gate lines on the other side. Also, single feeding may be adopted in the display device 100 of the present invention, in which the GIP driver GIP is placed on one side of the display area DA and gate lines are connected to the display area DA.

The data link lines PDL arranged in the non-display area NDA extend to the display area DA. Here, most of the data link lines PDL are connected to parts of the display area DA adjacent to the data driver D-IC and therefore do not intersect the gate link lines PGL. The intersections CRP of the data link lines PDL and the gate link lines PGL are formed at corners of the display area because the corners are curved.

Referring to FIG. 7, the first and second buffer layers BUF1 and BUF2 are placed on the substrate SUB, at the intersections CRP of the data link lines PDL and the gate link lines PGL. The gate insulating film GI is disposed on the second buffer layer BUF2, and the data link lines PDL are arranged on the gate insulating film GI. The first interlayer insulating film ILD1 is disposed on some data link lines PDL (for example, data link lines DU1), and some other data link lines PDL (for example, data link lines DU2) are arranged on the first interlayer insulating film ILD1. That is, the data link lines PDL are stacked alternately between different layers. The second interlayer insulating film ILD2 is disposed on the first interlayer insulating film ILD1 where some data link lines PDL are formed, and the gate link lines PGL are arranged on the second interlayer insulating film ILD2. The passivation film PAS is disposed on the gate link lines PGL.

However, patterning defects occur to the gate link lines PGL due to the step difference between the first and second interlayer insulating film ILD1 and ILD2 covering the data link lines PDL, thus leaving a residual film of the gate link lines PGL. The residual film causes a short circuit in the gate link lines PGL, which have to be patterned and separated from each other, and scan signals inputted through the gate link lines PGL will have operational defects.

Hereinafter, the present disclosure discloses a display device capable of preventing a short circuit in the gate link lines PGL.

Figure 8:
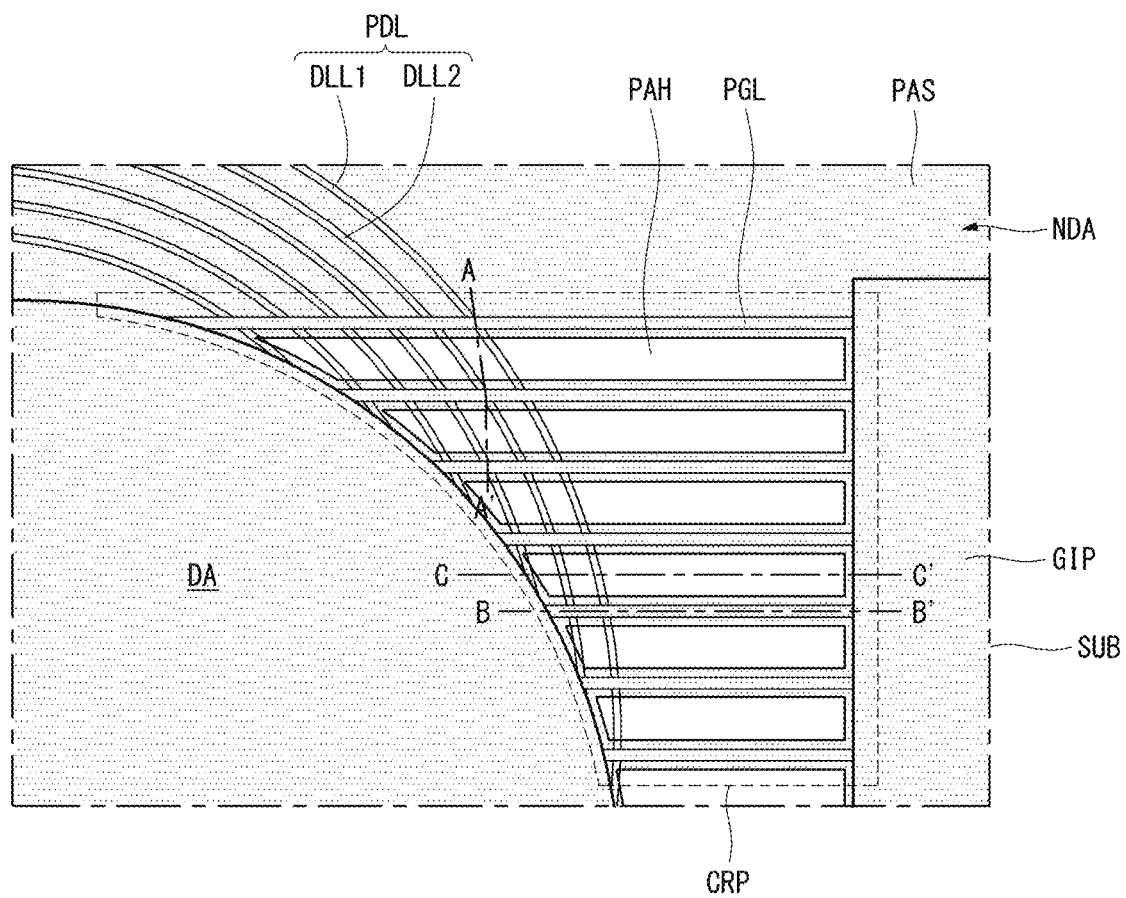
FIG. 8 is an enlarged plan view of the R1 area of FIG. 6 according to an embodiment of the present disclosure.
Figure 9:
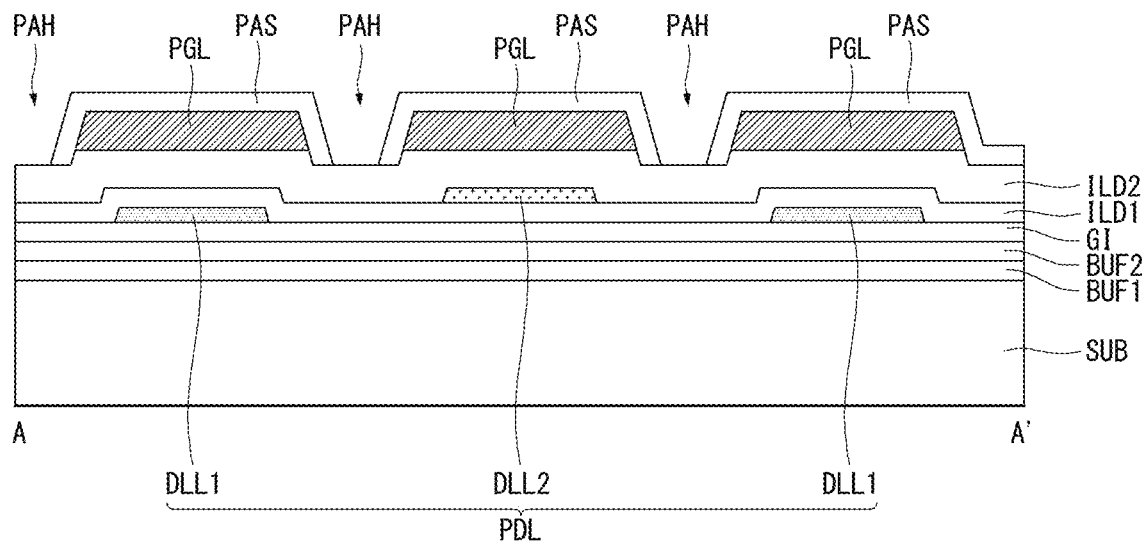
FIG. 9 is a cross-sectional view taken along the line A-A' in FIG. 8 according to an embodiment of the present disclosure.
Figure 10:
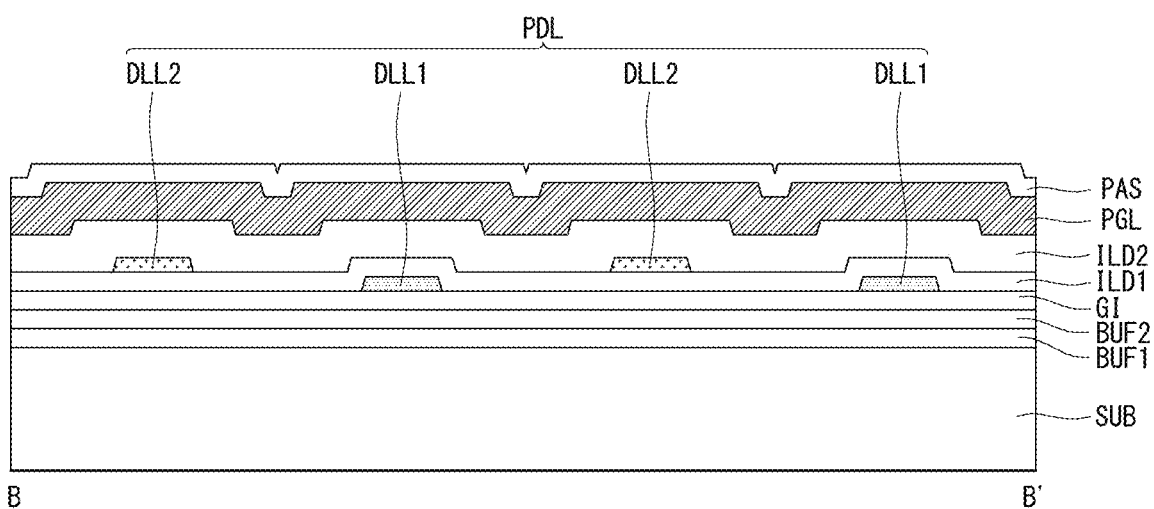
FIG. 10 is a cross-sectional view taken along the line B-B' in FIG. 8 according to an embodiment of the present disclosure.
Figure 11:
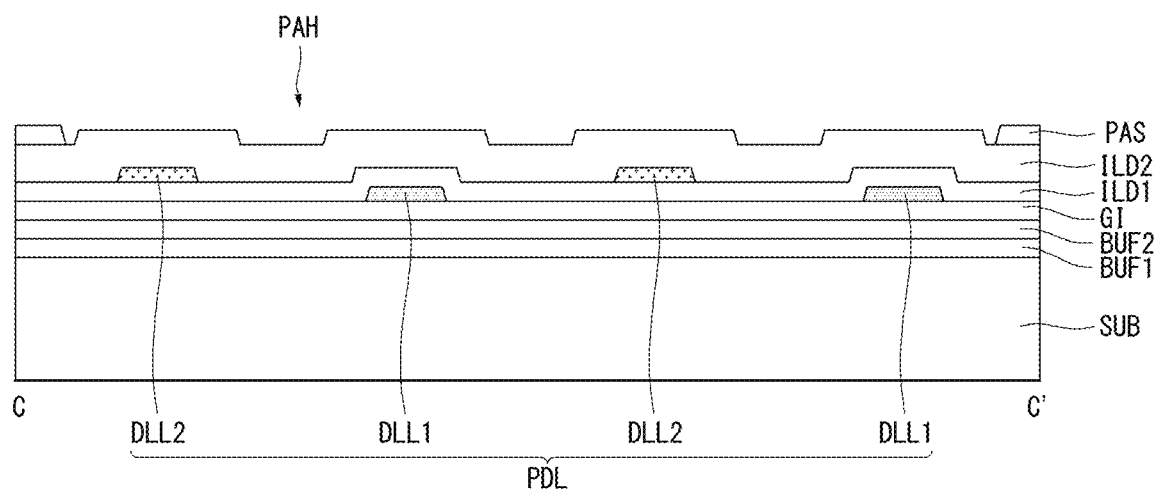
FIG. 11 is a cross-sectional view taken along the line C-C' in FIG. 8 according to an embodiment of the present disclosure.

FIG. 8 is an enlarged plan view of the R1 area of FIG. 6. FIG. 9 is a cross-sectional view taken along the line A-A' in FIG. 8. FIG. 10 is a cross-sectional view taken along the line B-B' in FIG. 8. FIG. 11 is a cross-sectional view taken along the line C-C' in FIG. 8.

Referring to FIG. 8, the data link lines PDL extending from the data driver D-IC to the display area DA and the gate link lines PGL extending from the GIP driver GIP to the display area DA are arranged in the non-display area NDA. The data link lines PDL are an alternating arrangement of first data link lines DLL1 and second data link lines DLL2. In the present disclosure, the data link lines PDL are not arranged on the same layer, but are divided into first data link lines DLL1 and second data link lines DLL2, which are then arranged on different layers, thereby enabling a narrow-bezel design.

A passivation film PAS is disposed over the entire substrate SUB where the data link lines PDL and the gate link lines PGL are formed. In the present disclosure, in the non-display area NDA where the data link lines PDL and the gate link lines PGL intersect, the passivation film PAS corresponding to the parts between the gate link lines PGL is etched away to form passivation holes PAH exposing the underlying second interlayer insulating film ILD2. The passivation holes PAH may be arranged between the gate link lines PGL, side by side with the gate link lines PGL. After patterning the gate link lines PGL, any gate link residual film left between the gate link lines PGL may be removed through a dry-etching process for forming the passivation holes PAH. Accordingly, the gate link lines PGL may not be short-circuited by the residual film, thereby preventing operational defects in scan signals.

Referring to FIGS. 9 to 11, a description will be given with respect to cross-sections of the non-display area NDA where the data link lines PDL and the gate link lines PGL intersect.

Referring to FIG. 9, a first buffer layer BUF1 is disposed on the substrate SUB, and a second buffer layer BUF2 is disposed on the first buffer layer BUF1. A gate insulating film GI is disposed on the second buffer layer BUF2, and first data link lines DLL1 are arranged at regular intervals on the gate insulating film GI. The first data link lines DLL1 are formed of the same material as the gate electrodes in the display area DA.

A first interlayer insulating film ILD1 is disposed on the substrate SUB where the first data link lines DLL1 are formed. Second data link lines DLL2 are arranged at regular intervals on the first interlayer insulating film ILD1. The second data link lines DLL2 are placed between each of the first data link lines DLL1, alternating with the first data link lines DLL1. The second data link lines DLL2 may be formed of low-resistance metal material—for example, molybdenum, titanium, aluminum, gold, silver, etc. The first data link lines DLL1 and the second data link lines DLL2 may be formed of the same metal material.

In the present disclosure, the data link lines PDL comprising the first data link lines DLL1 and second data link lines DLL2 are alternately arranged, with the first interlayer insulating film ILD1 in between. Thus, there is no need to take into consideration a patterning margin between the first data link lines DLL1 and the second data link lines DLL2, thereby enabling a narrow-bezel design.

A second interlayer insulating film ILD2 is disposed on the substrate SUB where the second data link lines DLL2 are arranged. Gate link lines PGL are arranged at regular intervals on the second interlayer insulating film ILD2. The gate link lines PGL are formed of the same material as the source electrodes SE and drain electrodes DE in the display area DA.

A passivation film PAS is disposed on the substrate SUB where the gate link lines PGL are formed. The passivation film PAS covers the gate link lines PGL, and has passivation holes PAH between the gate link lines PGL. The passivation holes PAH may be holes formed by etching the passivation film PAS. The passivation holes PAH expose the second interlayer insulating film ILD2 as the passivation film PAS is etched. Moreover, the underlying second interlayer insulating film ILD2 may be over-etched into the passivation holes PAH as the passivation film PAS is etched. Thus, the second interlayer insulating film ILD2 corresponding to the passivation holes PAH may be formed thinner than the other parts.

The passivation holes PAH are arranged between the gate link lines PGL, and after patterning the gate link lines PGL, any gate link residual film left between the gate link lines PGL may be removed through a dry-etching process for forming the passivation holes PAH. Accordingly, the gate link lines PGL may not be short-circuited by the residual film, thereby preventing operational defects in scan signals.

Meanwhile, as can be seen in the cross-sectional view in FIG. 10 taken along the gate link lines PGL, the first and second buffer layers BUF1 and BUF2 lie on the substrate SUB. The gate insulating film GI disposes on the second buffer layer BUF2, and the first data link lines DLL1 are arranged on the gate insulating film GI. The first interlayer insulating film ILD1 disposes on the first data link lines DLL1, and the second data link lines DLL2 are arranged on the first interlayer insulating film ILD1.

The second interlayer insulating film ILD2 disposes on the first interlayer insulating film ILD1 where the second data link lines DLL2 are formed, and the gate link lines PGL are arranged on the second interlayer insulating film ILD2. The passivation film disposes on the gate link lines PGL. That is, the passivation film PAS is placed over the gate link lines PGL, thereby protecting the gate link lines PGL from the outside.

As can be seen in the cross-sectional view in FIG. 11 taken along the passivation holes PAH, the first and second buffer layers BUF1 and BUF2 are disposed on the substrate SUB. The gate insulating film GI is disposed on the second buffer layer BUF2, and the first data link lines DLL1 are disposed on the gate insulating film GI. The first interlayer insulating film ILD1 is disposed on the first data link lines DLL1, and the second data link lines DLL2 are arranged on the first interlayer insulating film ILD1.

The second interlayer insulating film ILD2 is disposed on the first interlayer insulating film ILD1 where the second data link lines DLL2 are formed, and the passivation film PAS is disposed on the second interlayer insulating film ILD2. The passivation film PAS has passivation holes PAH exposing the underlying second interlayer insulating film ILD2. That is, the passivation holes PAH in the passivation film PAS are arranged between the gate link lines (not shown), whereby any gate link residual film left between the gate link lines (not shown) may be removed.

The specific arrangement of the first data link lines DLL1 and the second data link lines DLL2 shown in FIGS. 9-11 is only an example and is not for limiting, as long as the first data link lines DLL1 and the second data link lines DLL2 are arranged on different layers.

The passivation holes PAH of the present invention may be arranged in various configurations.

Figure 12:
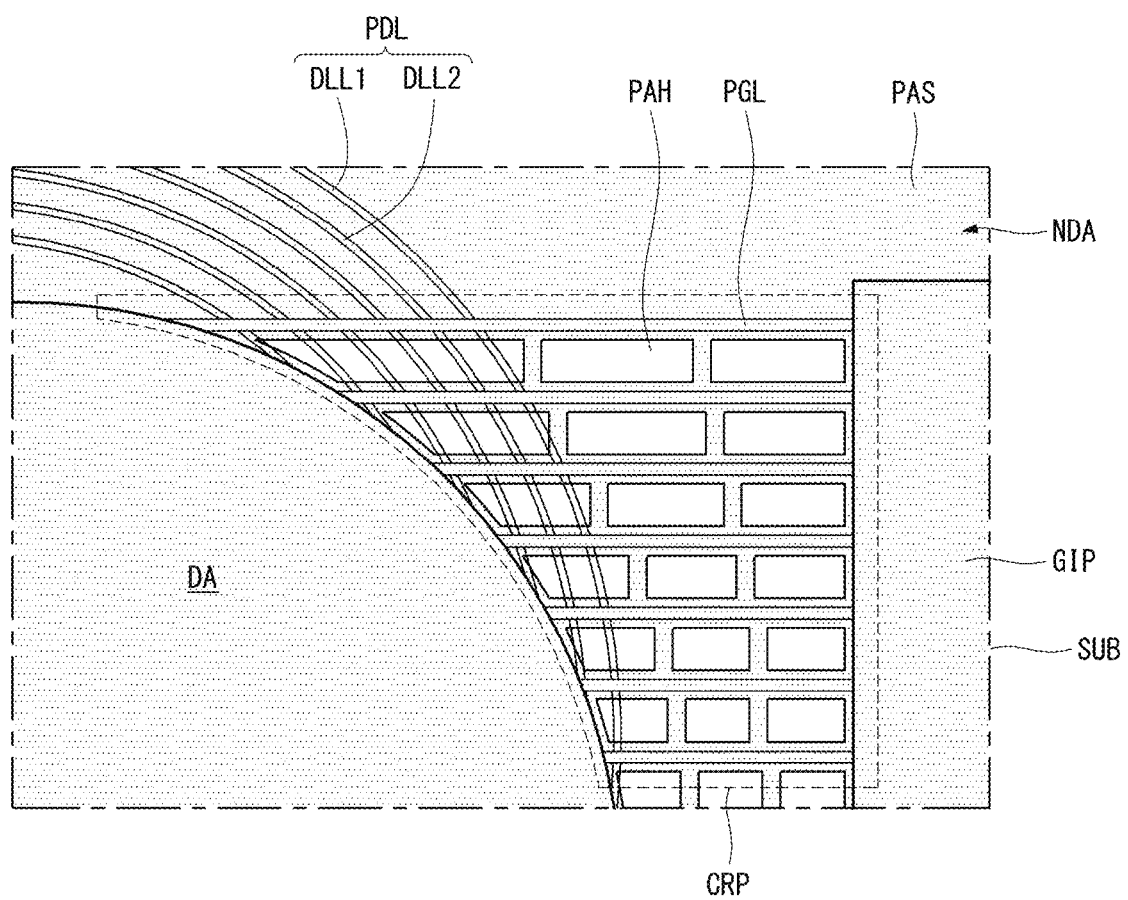
FIGS. 12 and 13 are plan views showing a display device with passivation holes coming in different configurations according to an embodiment of the present disclosure.
Figure 13:
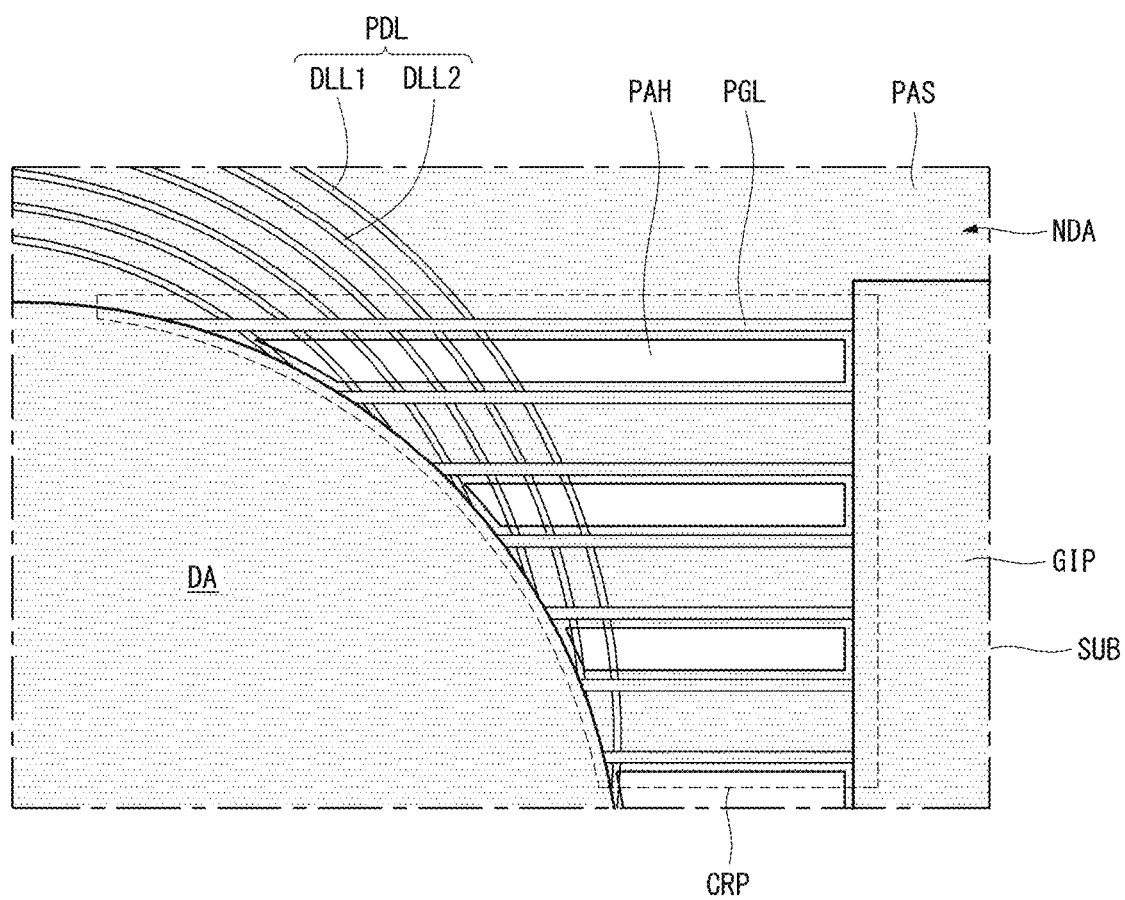

FIGS. 12 and 13 are plan views showing a display device with passivation holes coming in different configurations according to the present invention.

Referring to FIG. 12, the passivation holes PAH of the present disclosure may be arranged between each of the gate link lines PGL, and the passivation holes PAH may be arranged between two the gate link lines PGL, the passivation holes PAH is formed of a plurality of passivation holes. By arranging a plurality of passivation holes PAH between the gate link lines PGL, it is possible to prevent the underlying second data link lines from being exposed by the over-etching of the second interlayer insulating film in a dry-etching process of removing any gate link residual film and forming the passivation holes PAH.

Moreover, referring to FIG. 13, the passivation holes PAH of the present invention may be spaced out, with at least two gate link lines PGL in between, as opposed to what has been previously described in FIGS. 8 and 9.

As described above, in a display device according to an exemplary embodiment of the present invention, the passivation holes are arranged between the gate link lines, and after patterning the gate link lines, any gate link residual film left between the gate link lines may be removed through a dry-etching process for forming the passivation holes. Accordingly, the gate link lines may not be short-circuited by the residual film, thereby preventing operational defects in scan signals.

Hereinafter, the rate of short-circuit faults in the gate link lines of display devices according to a comparative example and an embodiment is shown.

Comparative Example

As shown in FIG. 7 above, a display device with no passivation holes formed between gate link lines was manufactured.

Embodiment

As shown in FIG. 8 above, a display device with passivation holes formed between gate link lines was manufactured.

Table 1 below is a table that shows the short-circuit fault rates of gate link lines of the display devices manufactured according to the comparative example and embodiment.

TABLE 1

|  | Comparative Example | Embodiment |
|---|---|---|
| Short-circuit fault rate (%) | 40% | 0% |

Referring to Table 1, the display device manufactured according to the comparative example showed a gate link line short-circuit fault rate of 40%, whereas the display device manufactured according to the embodiment showed a gate link line short-circuit fault rate of 0%.

From this, it can be inferred that the display device with passivation holes formed between gate link lines according to the embodiment of the present invention can prevent a short-circuit fault in the gate link lines.

As described above, in a display device according to an exemplary embodiment of the present invention, the passivation holes are arranged between the gate link lines, and after patterning the gate link lines, any gate link residual film left between the gate link lines may be removed through a dry-etching process for forming the passivation holes. Accordingly, the gate link lines may not be short-circuited by the residual film, thereby preventing operational defects in scan signals.

Throughout the description, it should be understood by those skilled in the art that various changes and modifications are possible without departing from the technical principles of the present disclosure. Although the present invention has been described by taking as an example an organic light-emitting display, the present invention is not limited to it but may be applicable to any display device as long as the display device comes with curved corners and a GIP driver. Therefore, the technical scope of the present disclosure is not limited to the detailed descriptions in this specification but should be defined by the scope of the appended claims.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
    a substrate comprising a display area where a plurality of sub-pixels are arranged and a non-display area surrounding the display area;
    a data driver disposed in the non-display area of the substrate;
    a gate-in-panel (GIP) driver disposed in the non-display area, adjacent to the display area;
    data link lines extending from the data driver to the display area;
    gate link lines extending from the GIP driver to the display area, the gate link lines are disposed on the data link lines at intersections of the data link lines and the gate link lines; and
    a passivation film disposed on the gate link lines,
    wherein the passivation film comprises one or more passivation holes that are arranged between the gate link lines so as not to overlap the gate link lines, at intersections of the data link lines and the gate link lines,
    wherein the data link lines comprise first data link lines and second data link lines which are arranged on different layers.

2. The display device of claim 1, wherein the passivation holes are parallel to the gate link lines and spaced apart from the gate link lines.

3. The display device of claim 2, wherein the passivation holes are disposed between two of the gate link lines, and the passivation holes comprise a plurality of passivation holes.

4. The display device of claim 2, wherein the plurality of passivation holes are spaced apart with at least two gate link lines in between.

5. The display device of claim 1, wherein each sub-pixel comprises:
    a semiconductor layer disposed on the substrate;
    a gate insulating film disposed on the semiconductor layer;
    a gate electrode disposed on the gate insulating film;
    a first interlayer insulating film disposed on the gate electrode;
    a second interlayer insulating film disposed on the first interlayer insulating film; and
    a source electrode and drain electrode disposed on the second interlayer insulating film and connected to the semiconductor layer.

6. The display device of claim 5, wherein the first data link lines are disposed between the gate insulating film and the first interlayer insulating film, and the second data link lines are disposed between the first interlayer insulating film and the second interlayer insulating film.

7. The display device of claim 6, wherein the first data link lines and the second data link lines are alternately disposed.

8. The display device of claim 6, wherein the gate link lines are disposed on the second interlayer insulating film.

9. The display device of claim 5, wherein the passivation holes penetrate the passivation film and exposes the second interlayer insulating film underlying the passivation film.

* * * * *